United States Patent
Chang et al.

(10) Patent No.: US 9,799,649 B2
(45) Date of Patent: Oct. 24, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW)

(73) Assignee: Taiwan Semiconductor Manufacturing Company Limited (TW)

( * ) Notice: Subject to any disclaimer, the term of this patent is extended or adjusted under 35 U.S.C. 154(b) by 0 days.

(21) Appl. No.: 15/009,760

(22) Filed: Jan. 28, 2016

(65) Prior Publication Data
US 2017/0179118 A1    Jun. 22, 2017

Related U.S. Application Data

(60) Provisional application No. 62/269,030, filed on Dec. 17, 2015.

(51) Int. Cl.
| | |
|---|---|
| *H01L 27/088* | (2006.01) |
| *H01L 29/423* | (2006.01) |
| *H01L 29/06* | (2006.01) |
| *H01L 29/66* | (2006.01) |
| *H01L 21/306* | (2006.01) |
| *H01L 29/78* | (2006.01) |
| *H01L 29/08* | (2006.01) |

(52) U.S. Cl.
CPC .... *H01L 27/0886* (2013.01); *H01L 21/30604* (2013.01); *H01L 29/0657* (2013.01); *H01L 29/0847* (2013.01); *H01L 29/42364* (2013.01); *H01L 29/66545* (2013.01); *H01L 29/66795* (2013.01); *H01L 29/7848* (2013.01)

(58) Field of Classification Search
CPC .......... H01L 27/0886; H01L 29/42364; H01L 29/0657; H01L 29/0847; H01L 29/66795; H01L 21/30604; H01L 29/7848; H01L 29/66545
See application file for complete search history.

(56) References Cited

U.S. PATENT DOCUMENTS

| | | | |
|---|---|---|---|
| 2004/0026736 A1* | 2/2004 | Grupp | H01L 21/28537 257/330 |
| 2005/0139860 A1* | 6/2005 | Snyder | H01L 29/0653 257/155 |
| 2013/0249003 A1* | 9/2013 | Oh | H01L 21/845 257/347 |
| 2014/0239396 A1* | 8/2014 | Liu | H01L 21/28008 257/347 |

(Continued)

*Primary Examiner* — Victor A Mandala
(74) *Attorney, Agent, or Firm* — Cooper Legal Group, LLC

(57) ABSTRACT

A semiconductor device includes at least one semiconductor fin, a gate electrode, at least one gate spacer, and a gate dielectric. The semiconductor fin includes at least one recessed portion and at least one channel portion. The gate electrode is present on at least the channel portion of the semiconductor fin. The gate spacer is present on at least one sidewall of the gate electrode. The gate dielectric is present at least between the channel portion of the semiconductor fin and the gate electrode. The gate dielectric extends farther than at least one end surface of the channel portion of the semiconductor fin.

20 Claims, 17 Drawing Sheets

(56) References Cited

U.S. PATENT DOCUMENTS

| | | | |
|---|---|---|---|
| 2014/0353731 A1* | 12/2014 | Colinge | H01L 29/7843 257/288 |
| 2016/0005735 A1* | 1/2016 | Costrini | H01L 27/0886 257/401 |
| 2016/0233246 A1* | 8/2016 | Anderson | H01L 29/7853 |
| 2017/0047419 A1* | 2/2017 | Glass | H01L 29/66795 |

* cited by examiner

SEMICONDUCTOR DEVICE AND MANUFACTURING METHOD THEREOF

PRIORITY CLAIM AND CROSS-REFERENCE

This application claims priority to U.S. Provisional Application Ser. No. 62/269,030, filed Dec. 17, 2015, which is herein incorporated by reference.

BACKGROUND

Semiconductor devices are small electronic components that are fabricated on a semiconductor wafer substrate. Using a variety of fabrication techniques, these devices are made and connected together to form integrated circuits. A number of integrated circuits may be found on one chip, and are capable of performing a set of useful functions in the operation of an electronic appliance. Examples of such electronic appliances are mobile telephones, personal computers, and personal gaming devices. As the size of these popular devices would imply, the components formed on a chip are small.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 8A are perspective views of a method for manufacturing a semiconductor device at various stages in accordance with some embodiments of the present disclosure.

FIGS. 1B to 8B are cross-sectional views respectively taking along lines B-B in FIGS. 1A to 8A.

FIGS. 1C to 8C are cross-sectional views respectively taking along lines C-C in FIGS. 1B to 8B.

DETAILED DESCRIPTION

Figure 1A:
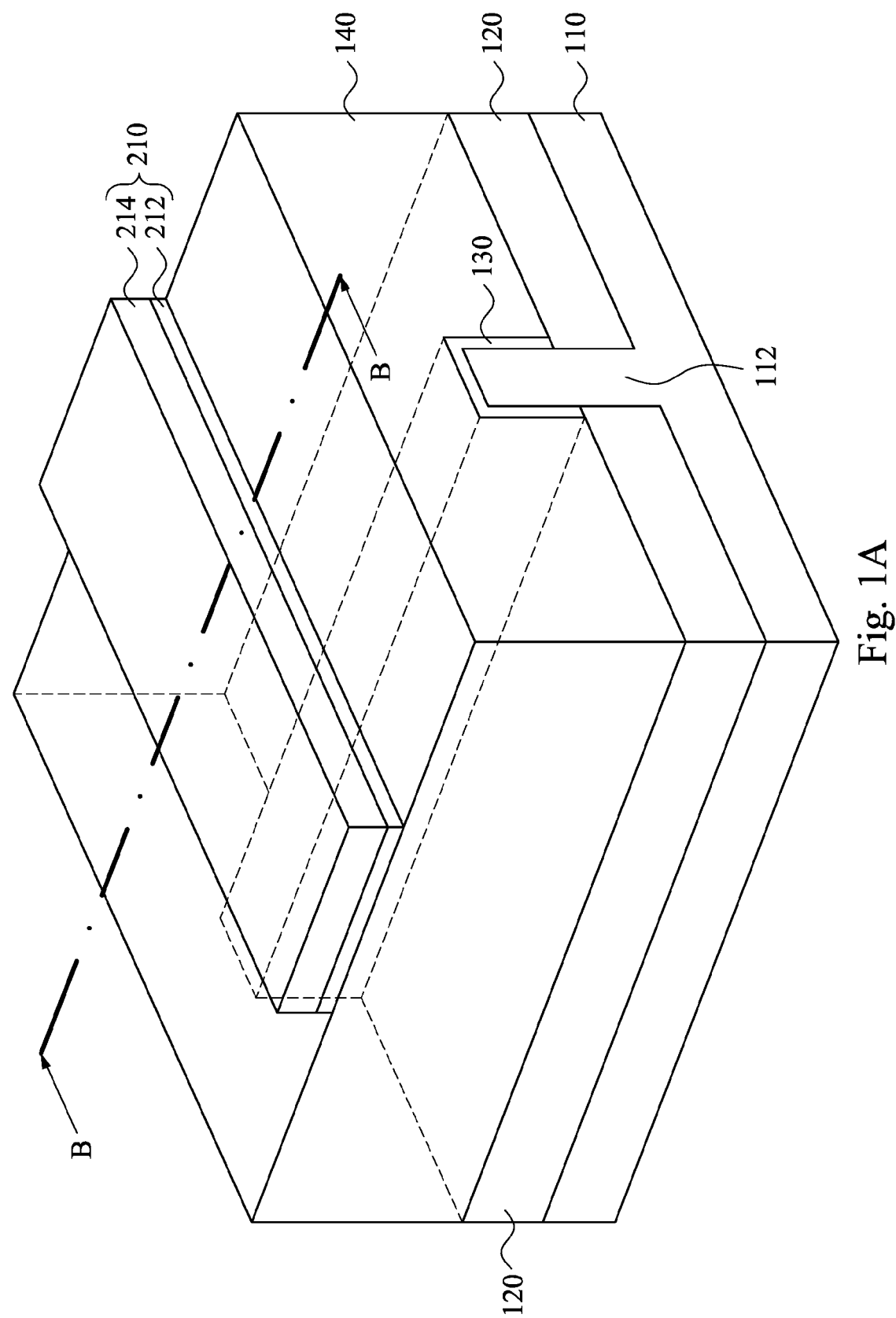

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, is a Fin field effect transistor (FinFET) device. The following disclosure will continue with a FinFET example to illustrate various embodiments of the present application. It is understood, however, that the application should not be limited to a particular type of device.

Figure 1B:
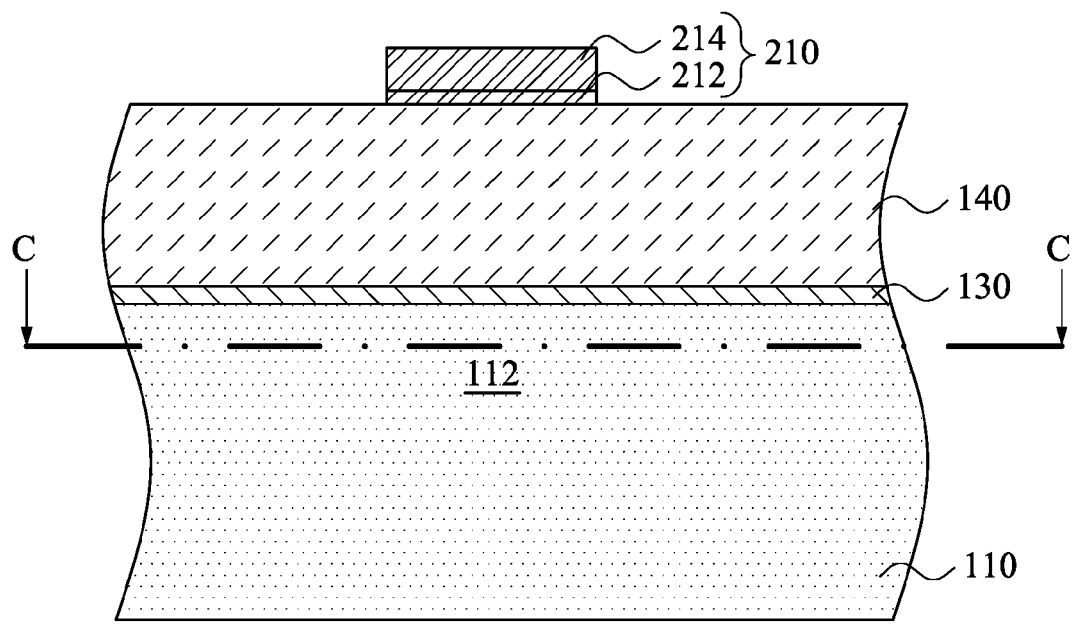
Figure 1C:
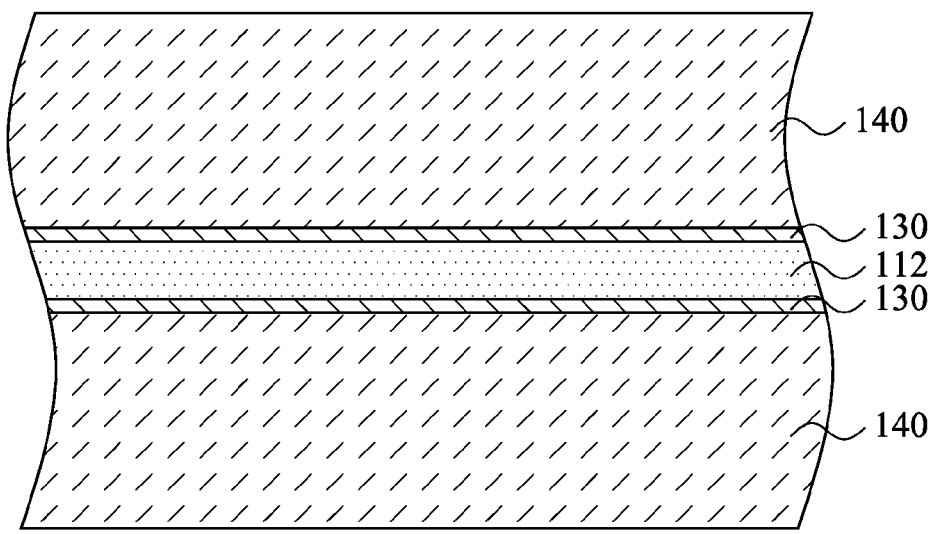

FIGS. 1A to 8A are perspective views of a method for manufacturing a semiconductor device at various stages in accordance with some embodiments of the present disclosure, FIGS. 1B to 8B are cross-sectional views respectively taking along lines B-B in FIGS. 1A to 8A, and FIGS. 1C to 8C are cross-sectional views respectively taking along lines C-C in FIGS. 1B to 8B. Reference is made to FIGS. 1A, 1B, and 1C. A substrate 110 is provided. In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method.

At least one semiconductor fin 112 is formed on the substrate 110. In some embodiments, the semiconductor fin 112 includes silicon. It is note that the number of the semiconductor fin 112 in FIG. 1A is illustrative, and should not limit the claimed scope of the present disclosure. A person having ordinary skill in the art may select suitable number for the semiconductor fin 112 according to actual situations.

The semiconductor fin 112 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fin 112 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In FIG. 1A, a plurality of isolation structures 120 are formed on the substrate 110. The isolation structures 120, which act as a shallow trench isolation (STI) around the semiconductor fin 120, may be formed by chemical vapor deposition (CVD) techniques using tetra-ethyl-ortho-silicate (TEOS) and oxygen as a precursor. In some other embodiments, the isolation structures 120 may be formed by implanting ions, such as oxygen, nitrogen, carbon, or the like, into the substrate 110. In yet some other embodiments, the isolation structures 120 are insulator layers of a SOI wafer.

A gate dielectric 130 is formed to cover the semiconductor fins 112. The gate dielectric 130 may be formed by thermal oxidation, chemical vapor deposition, sputtering, or other methods known and used in the art for forming a gate dielectric. Depending on the technique of dielectric layer formation, the thickness of the gate dielectric 130 on the top of the semiconductor fins 112 may be different from the thickness of the gate dielectric 130 on the sidewall (not shown) of the semiconductor fins 112. The gate dielectric 130 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The gate dielectric 130 may have a multilayer structure such as one layer of silicon oxide (e.g., interfacial layer) and another layer of high-k material.

A dummy layer 140 is formed on the gate dielectric 130. The dummy layer 140 may be deposited by chemical vapor deposition (CVD), by sputter deposition, or by other techniques known and used in the art for depositing conductive materials. The dummy layer 140 may include polycrystalline-silicon (poly-Si) or poly-crystalline silicon-germanium (poly-SiGe). For example, in some embodiments, the dummy layer 140 includes polysilicon deposited undoped by low-pressure chemical vapor deposition (LPCVD). The polysilicon may also be deposited, for example, by furnace deposition of an in-situ doped polysilicon. Alternatively, the dummy layer 130 may includes other suitable materials. Further, the dummy layer 140 may be doped poly-silicon with uniform or non-uniform doping.

A mask layer 210 is formed on the dummy layer 140 by suitable process(es) to a suitable thickness. The mask layer 210 covers a portion of the dummy layer 140 while leaves other portions of the dummy layer 140 uncovered. The mask layer 210, in some embodiments, is a hard mask layer which includes silicon oxide. The mask layer 210, in some other embodiments, may include silicon nitride (SiN), silicon oxynitride (SiON), silicon carbide (SiC), SiOC, spin-on glass (SOG), a low-K film, tetraethylorthosilicate (TEOS), plasma enhanced CVD oxide (PE-oxide), high-aspect-ratio-process (HARP) formed oxide, amorphous carbon material, tetraethylorthosilicate (TEOS), other suitable materials, and/or combinations thereof. The silicon oxide layer may be formed using methods such as CVD, PVD, or ALD and may have a thickness ranging from about 100 Angstroms to about 500 Angstroms. In some other embodiments, the mask layer 210 may be a photo-resist layer. The photo-resist layer is deposited on the dummy layer 140, for example, by spin coating, and is used to form an intended pattern by way of irradiating, developing, drying, etching, and other suitable processes. In some embodiments, the mask layer 210 includes a silicon nitride layer 212 disposed on the dummy layer 140 and an oxide layer 214 disposed on the silicon nitride layer 212.

Figure 2A:
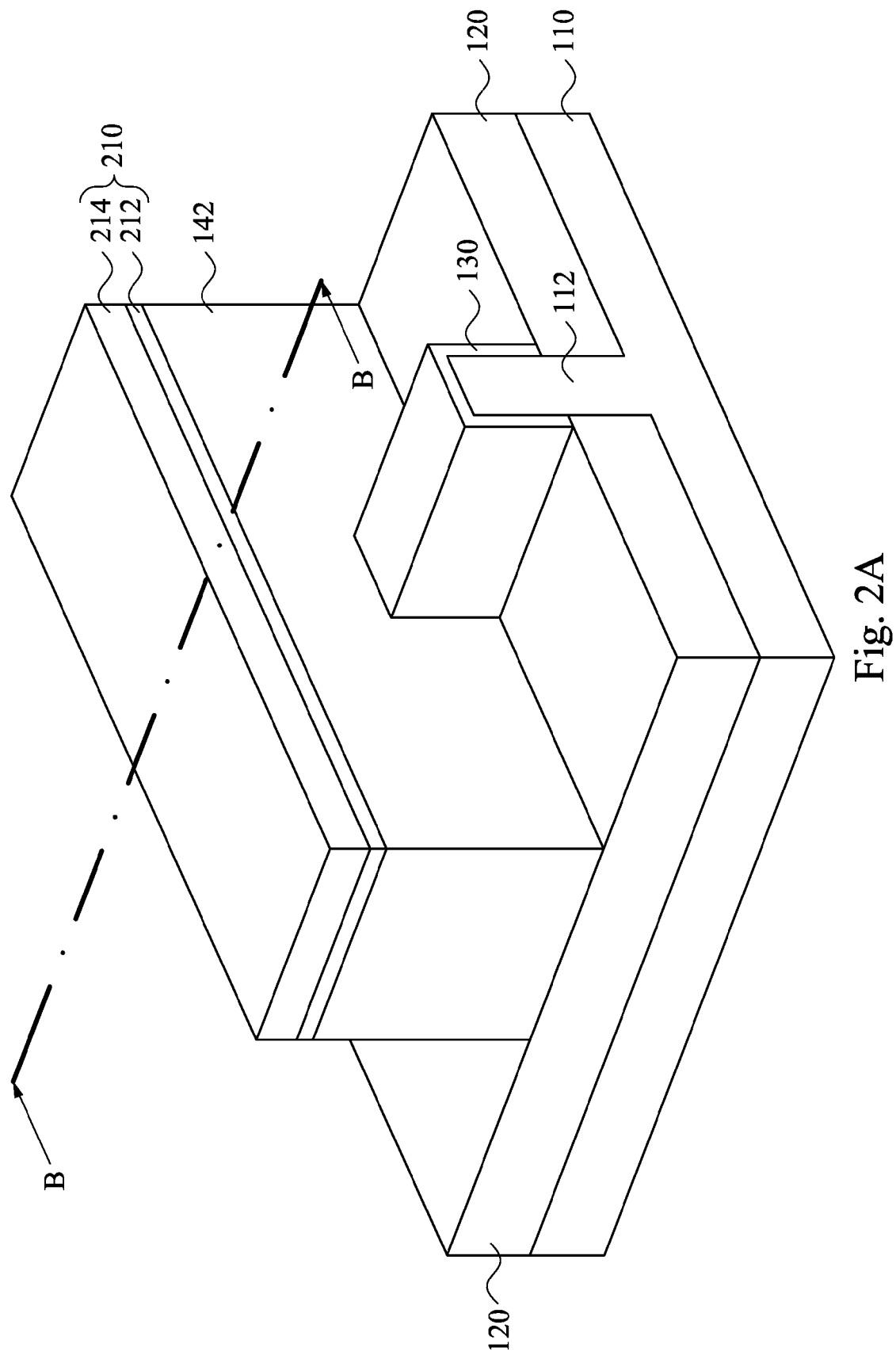
Figure 2B:
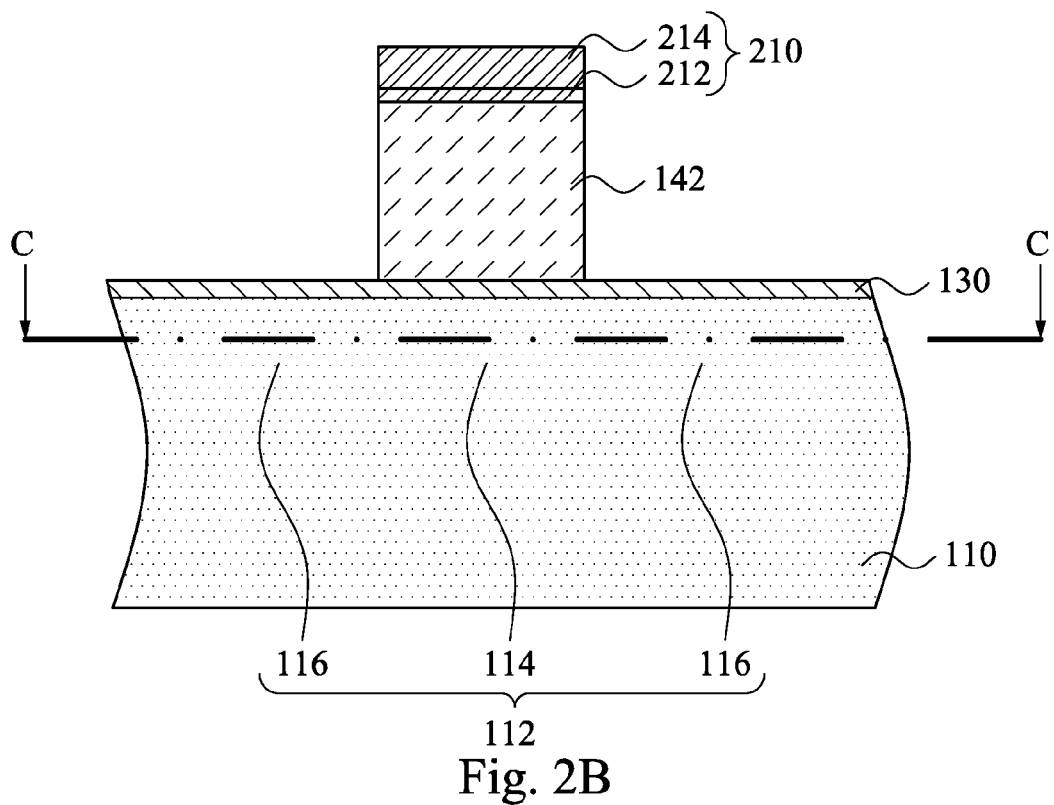
Figure 2C:
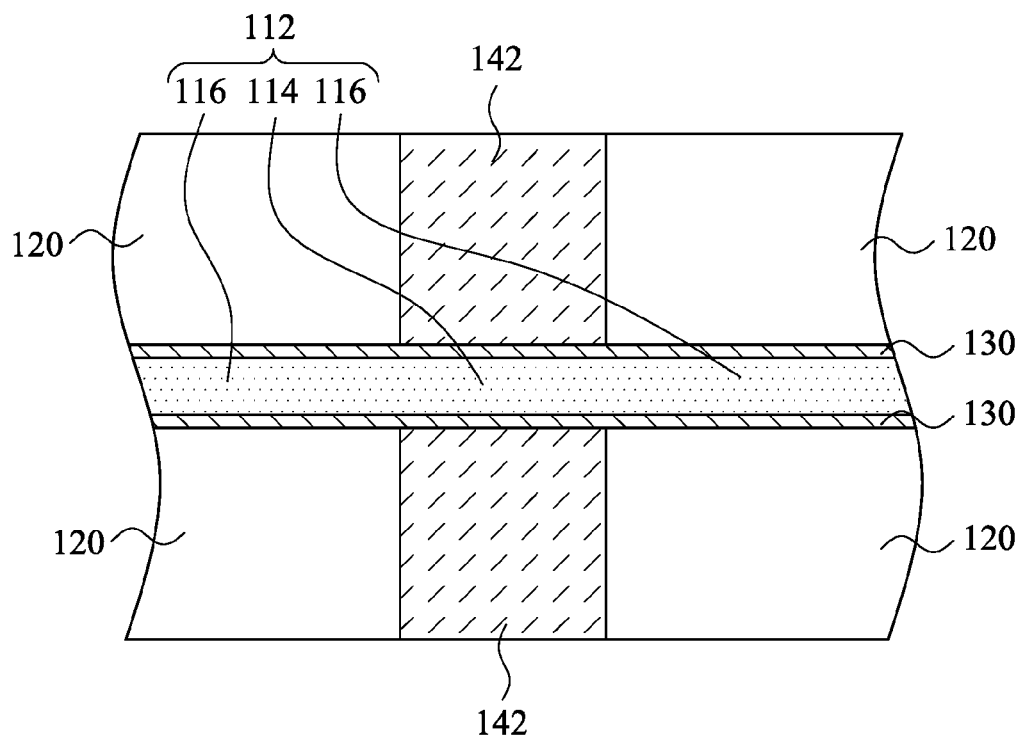

Reference is made to FIGS. 2A, 2B, and 2C. A removing (or etch) process is performed to remove portions other than the intended pattern of the dummy layer 140 (see FIGS. 1A, 1B, and 1C) (i.e., the portions uncovered by the mask layer 210) to form a dummy gate 142. In some embodiments, such an etch process may be performed multiple times. However, the patterning process is not limited to a photolithography process using photo-resists, and may be performed by an immersion lithography, electron beam lithography, or other suitable processes. As a result, the pattern of the dummy gate 142 as shown in FIGS. 2A, 2B, and 2C is obtained. At least a portion of the semiconductor fin 112 covered by the dummy gate 142 is referred as a channel portion 114 of the semiconductor fin 112, and other portions of the semiconductor fin 112 uncovered by the dummy gate 142 is referred as uncovered portions 116.

Figure 3A:
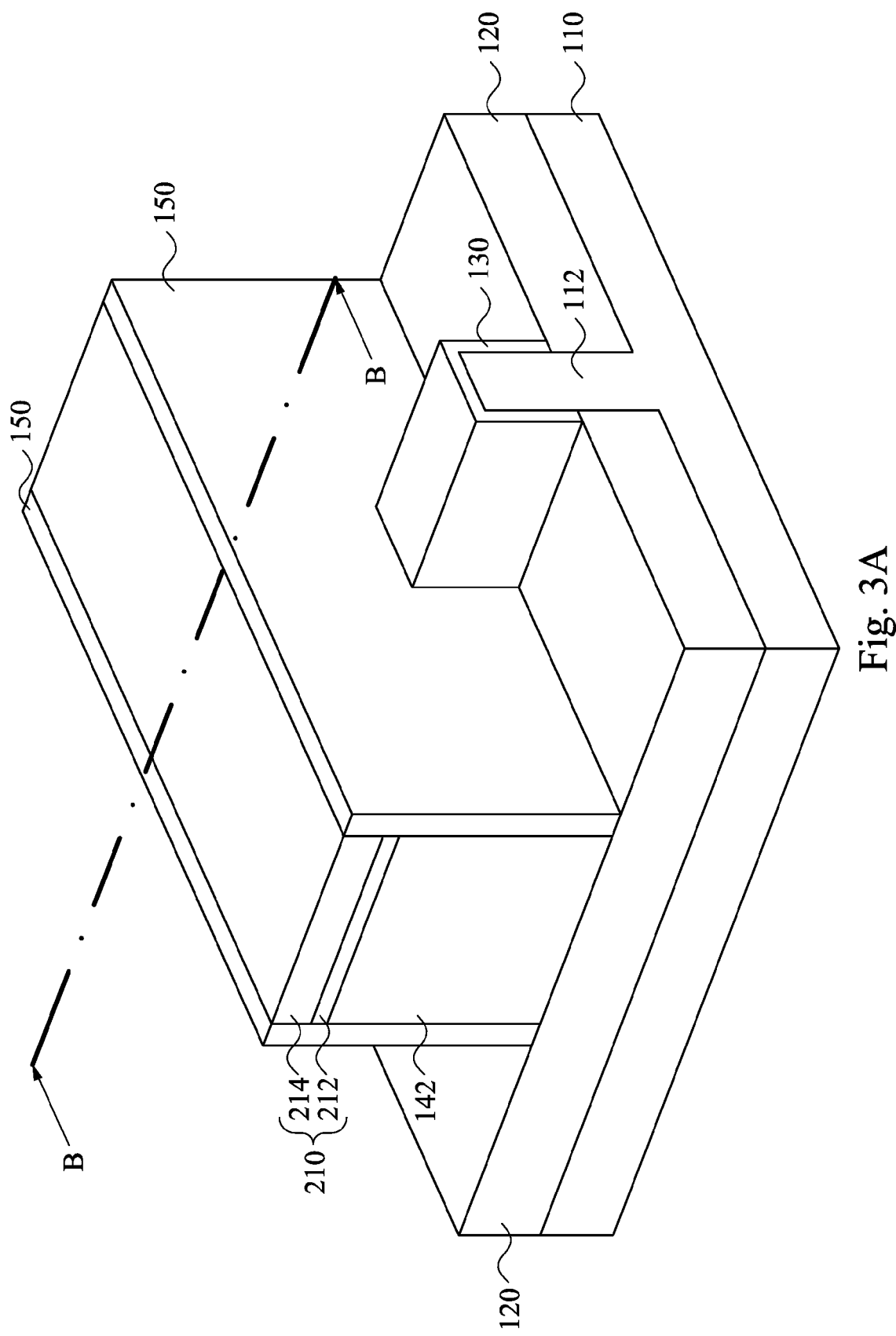
Figure 3B:
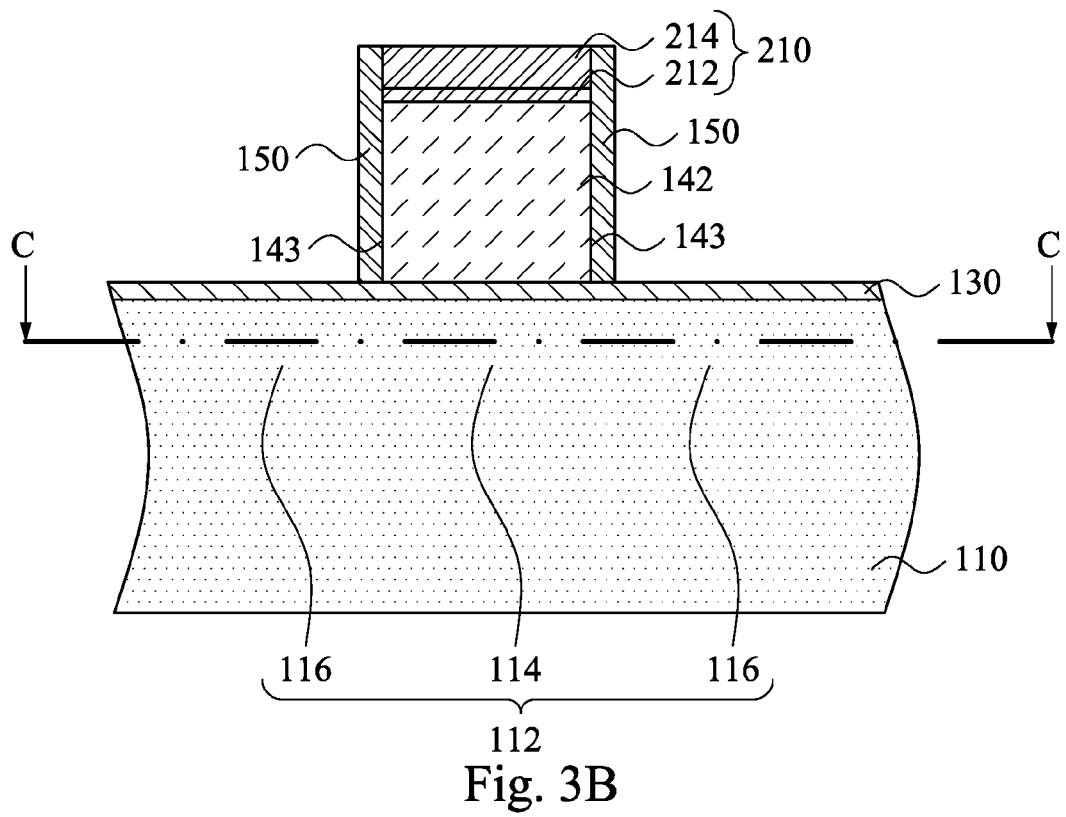
Figure 3C:
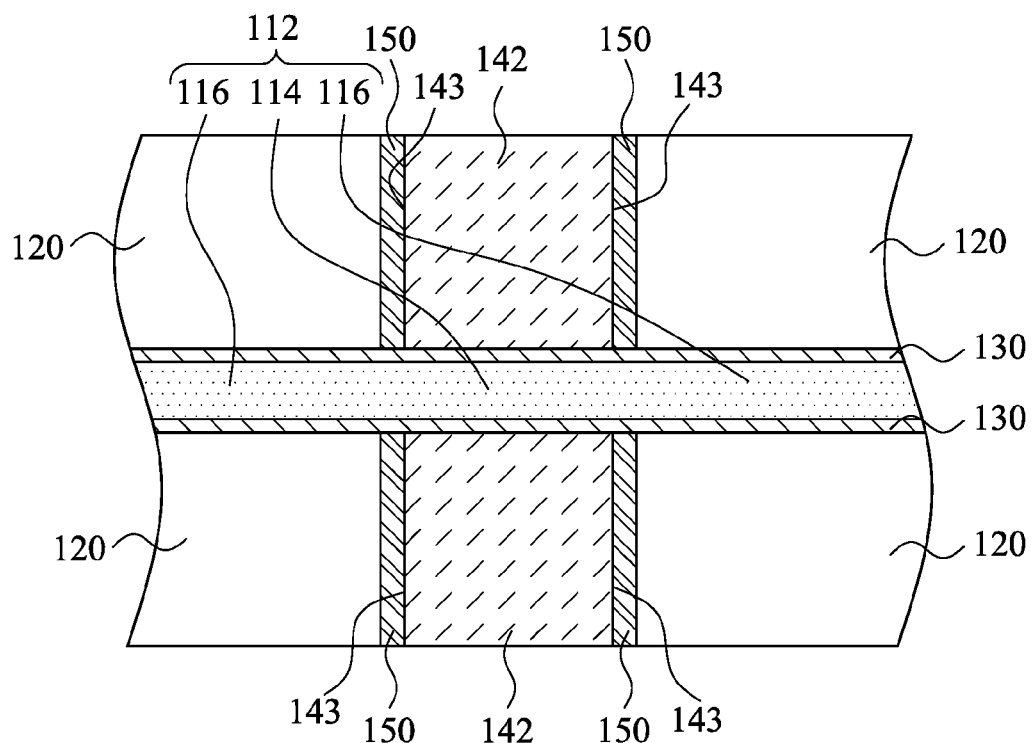

Reference is made to FIGS. 3A, 3B, and 3C. A plurality of gate spacers 150 are formed on opposing sidewalls 143 of the dummy gate 142 and the mask layer 210. In some embodiments, at least one of the gate spacers 150 includes single or multiple layers. The gate spacers 150 can be formed by blanket depositing one or more dielectric layer(s) (not shown) on the previously formed structure. The dielectric layer(s) may include silicon nitride (SiN), oxynitride, silicion carbon (SiC), silicon oxynitride (SiON), oxide, and the like and may be formed by methods utilized to form such a layer, such as CVD, plasma enhanced CVD, sputter, and other methods known in the art. The gate spacers 150 may include different materials with different etch characteristics than the dummy layer 140 so that the gate spacers 150 may be used as masks for the removing of the dummy gate 142 (described below with references to FIGS. 7A, 7B, and 7C). The gate spacers 150 may then be patterned, such as by one or more etches to remove the portions of the gate spacers 150 from the horizontal surfaces of the structure.

In some embodiments, when one or more dielectric layer(s) (not shown) are blanket deposited on the previously formed structure, the dielectric layer(s) may covers the uncovered portions 116 of the semiconductor fin 112. These portions of the dielectric layer(s) are then patterned to form fin sidewall structures on opposite sides of the uncovered portions 116 of the semiconductor fin 112. However, in some other embodiments, the fin sidewall structures can be omitted.

Figure 4A:
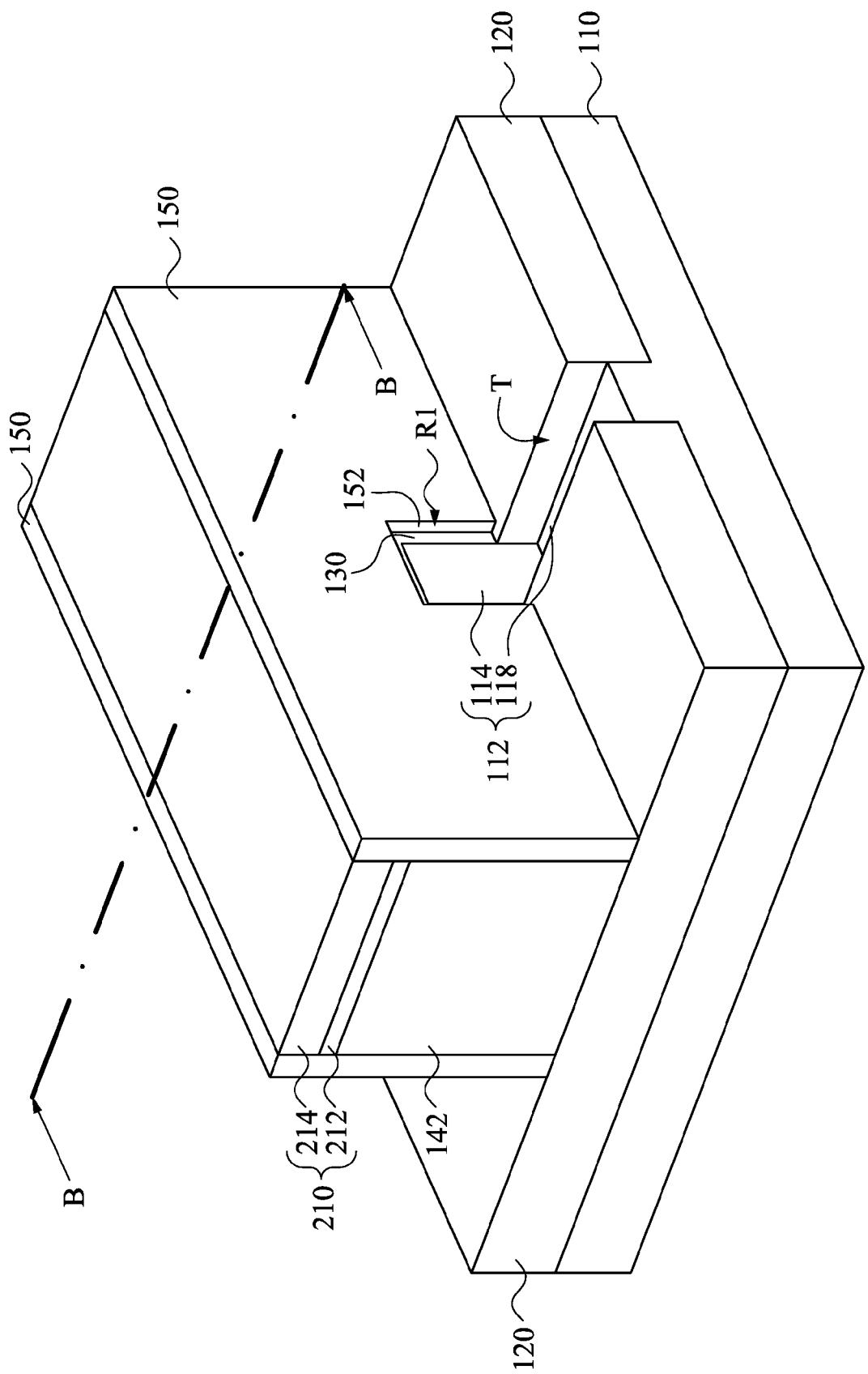
Figure 4B:
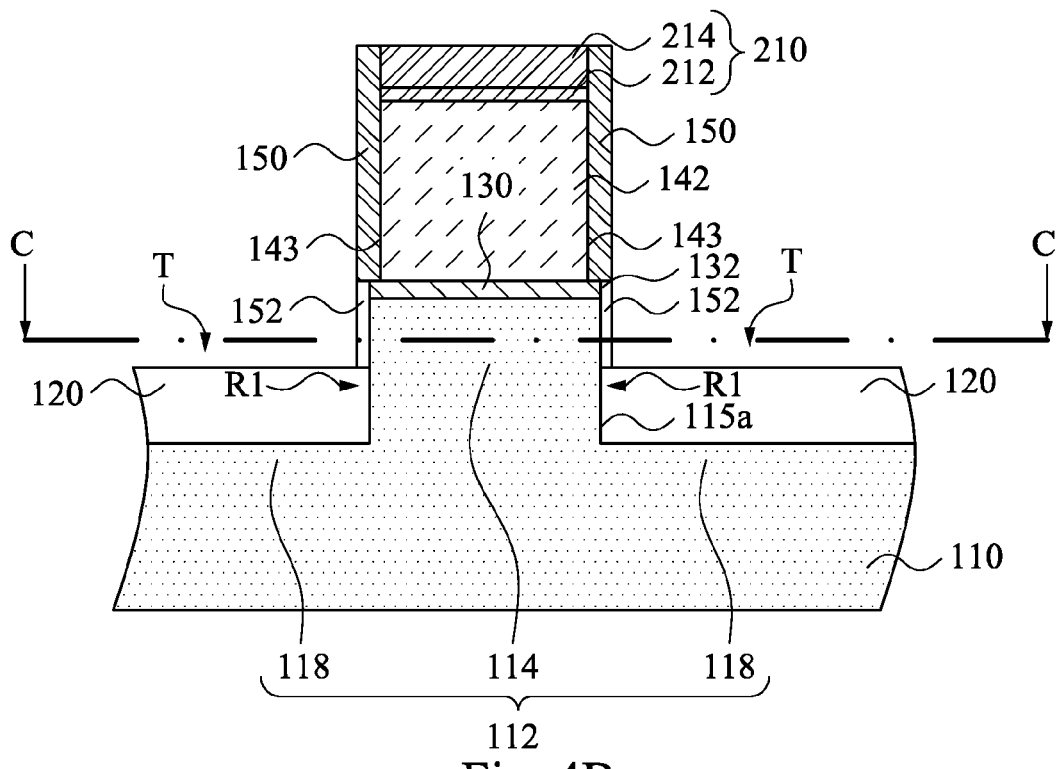
Figure 4C:
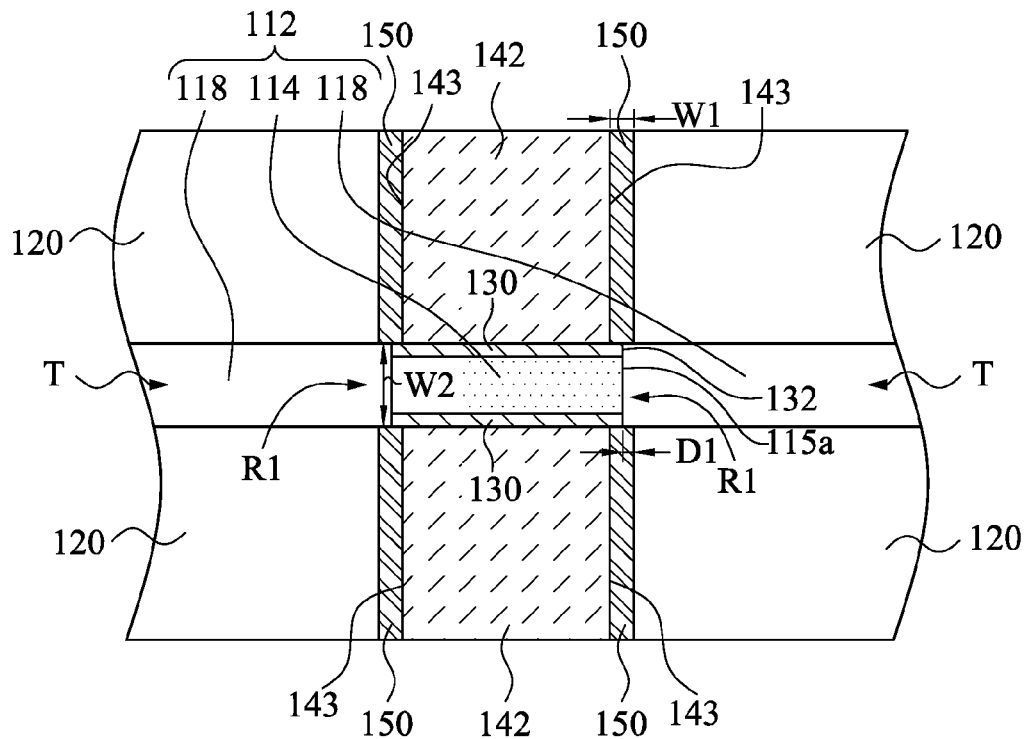

Reference is made to FIGS. 4A, 4B, and 4C. The uncovered portions 116 (see FIGS. 3A, 3B, and 3C) of the semiconductor fin 112 and portions of the gate dielectric 130 disposed thereon are both removed (or recessed) to form trenches T in the substrate 110. Any suitable amount of material may be removed. The remaining semiconductor fin 112 includes the channel portion 114 and recessed portions 118, where the trenches T are respectively formed on the recessed portions 118.

In FIGS. 4A, 4B, and 4C, the gate dielectric 130 and the semiconductor fin 112 are overetched, such that the channel portion 114 of the semiconductor fin 112 and the remaining gate dielectric 130 are shrunk inward the gate spacers 150 for a lateral distance D1 (see FIG. 4C). At least one recess R1 is formed between one of the gate spacers 150, the gate dielectric 130, and the semiconductor fin 112. That is, the gate spacer 150 is present on the recess R1. In some embodiments, at least one of the gate spacers 150 has a width W1, and the distance D1 is less than the width W1. In other words, the gate dielectric 130 is in contact with at least one of the gate spacers 150 and leaves at least a portion of at least one inner wall 152 of the gate spacer 150 uncovered, where the inner wall 152 is a surface facing the semiconductor fin 112. Also, the gate dielectric 130 extends farther than the sidewall 143 of the gate electrode 142. The gate spacers 150 are still present on portions of the gate dielectric 130. Furthermore, the recess R1 has a width W2. Moreover, in FIGS. 4B and 4C, an end surface 115a of the channel portion 114 of the semiconductor fin 112 facing the recessed portion 118 of the semiconductor fin 112 and an end surface 132 of the gate dielectric 130 facing the recessed portion 118 of the semiconductor fin 112 are substantially continuous. The term "substantially" as used hereinafter may be applied to modify any quantitative representation which could permissibly vary without resulting in a change in the basic function to which it is related.

Figure 5A:
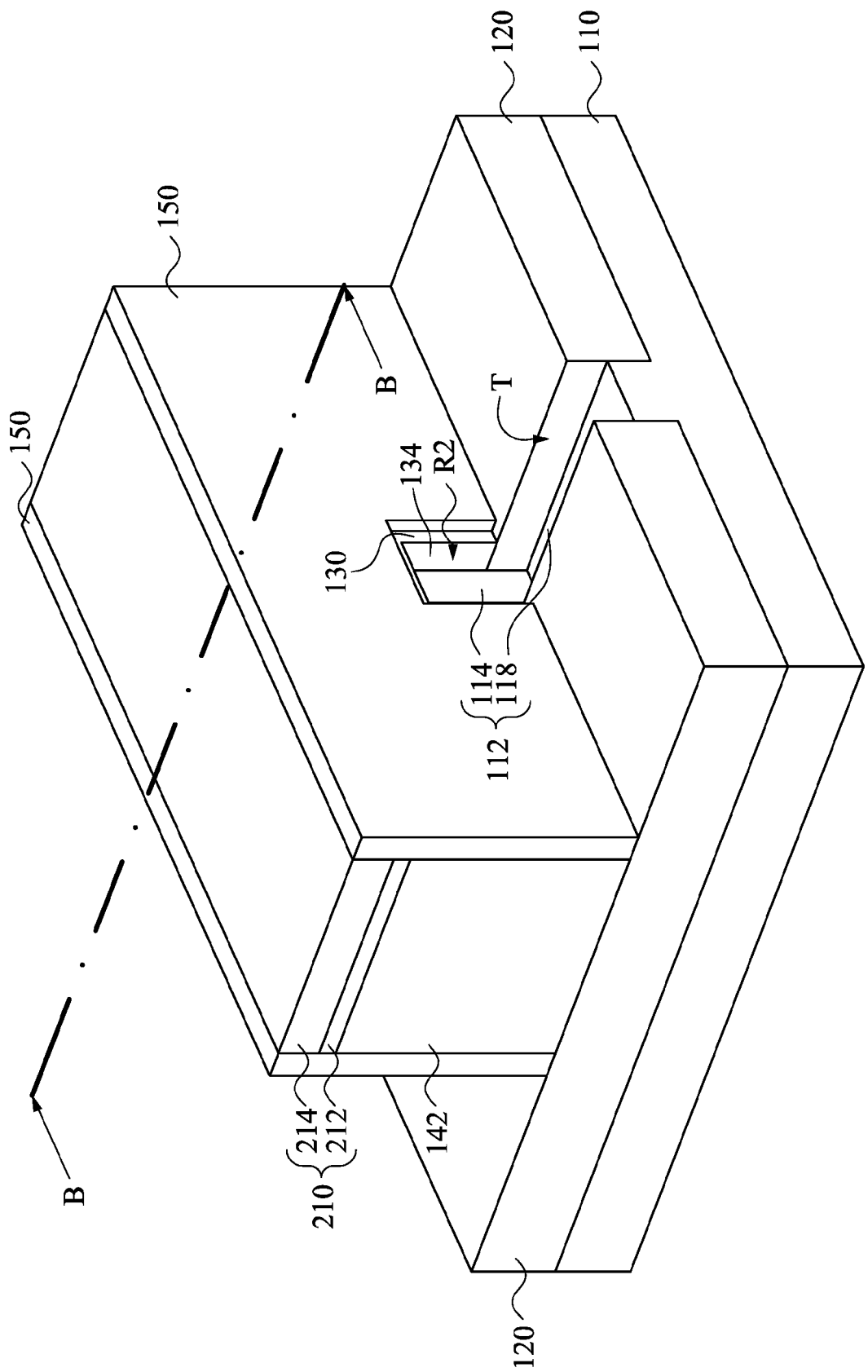
Figure 5B:
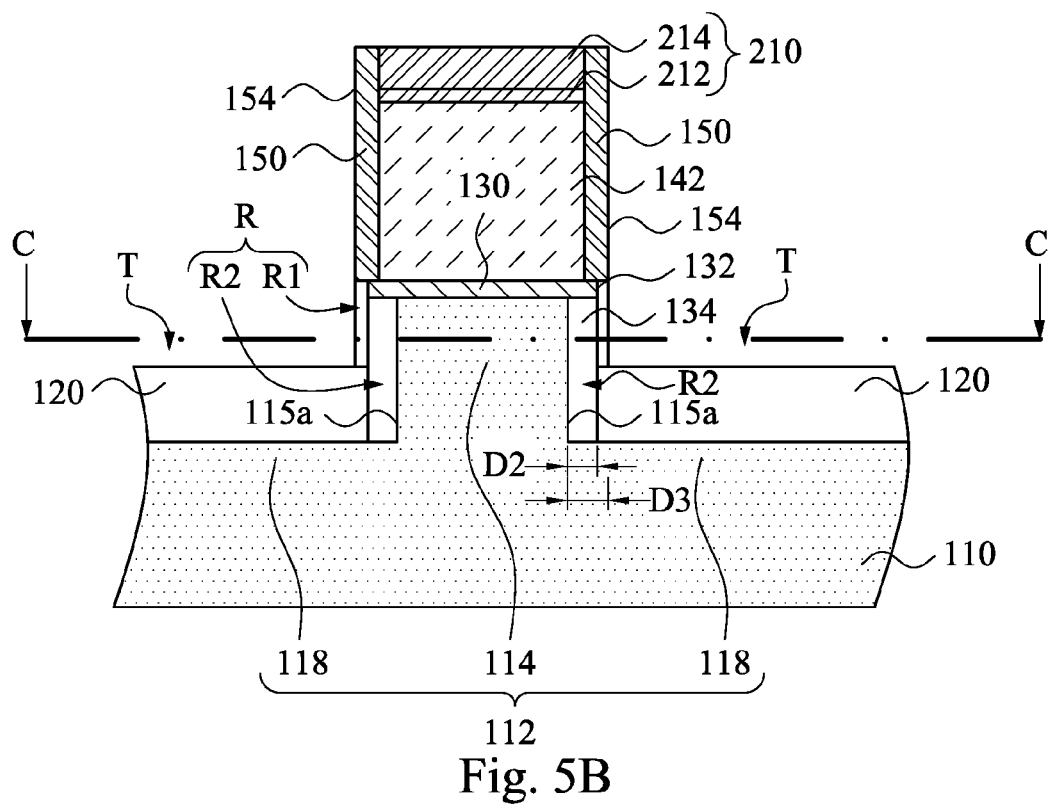
Figure 5C:
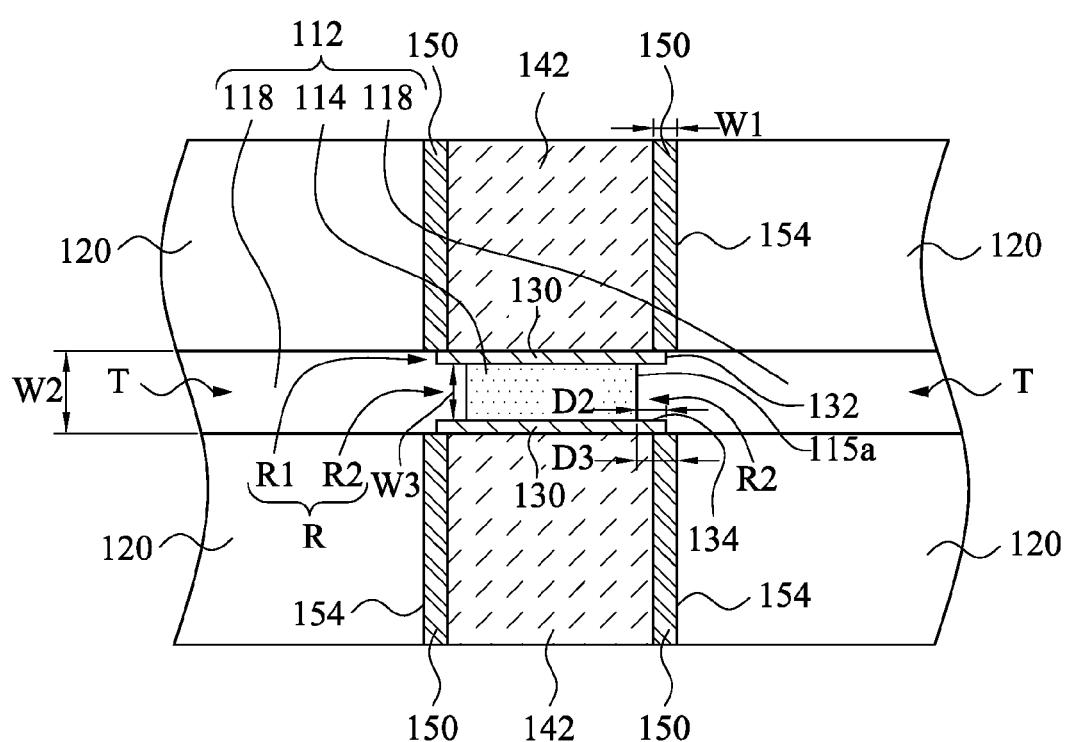

Reference is made to FIGS. 5A, 5B, and 5C. At least another portion of the channel region 114 of the semiconductor fin 112 is removed (or etched) to form another recess R2 under the gate dielectric 130. In other words, the channel region 114 of the semiconductor fin 112 further shrinks inward for a lateral distance D2. Or, the recessed portion 118 of the semiconductor fin 112 extends beneath the gate dielectric 130 for the lateral distance D2. The recess R2 has a width W3, and the width W2 of the recess R1 is greater than the width W3 of the recess R3. To explain from another view, a combination of the semiconductor fin 112, the gate dielectric 130, and the gate spacer 150 define a recess R therein. The recess R has a first region (i.e., the first recess R1) and a second region (i.e., the second recess R2). The first region has the width W2 greater than the width W3 of the second region. Furthermore, after the removing processes of FIGS. 4A (4B, 4C) to 5A (5B, 5C), the channel region 114 of the semiconductor fin 112 shrinks inward from a sidewall 154 of the gate spacer 150 for a lateral distance D3. The lateral distance D3 is equal to the sum of lateral distance D1 and the lateral distance D2. Or, the recessed portion 118 of the semiconductor fin 112 extends from the sidewall 154 of at least one of the gate spacers 150 for the lateral distance D3. Or, the end surface 115a of the channel portion 115 of the semiconductor fin 112 is separated from the sidewall 154 of the gate spacer 150 at the lateral distance D3. Therefore, the end surface 115a of the channel portion 114 of the semiconductor fin 112 and the end surface 132 of the gate dielectric 130 are discontinuous. In other words, the end surface 115a of the channel portion 114 of the semiconductor fin 112, the end surface 132 of the gate dielectric 130, and the inner walls 134 of the gate dielectric 130 form a step profile.

The removing process may include dry etching process, wet etching process, and/or combination thereof. The removing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

In FIG. 5C, the lateral distance D3 of the semiconductor fin 112 is greater than the width W1 of the gate spacer 150. That is, the end surface 115a of the channel portion 114 is located under the dummy gate 142. Furthermore, the dummy gate 142 is present on at least a portion of the recessed portion 118 of the semiconductor fin 112. However, the claimed scope of the present disclosure is not limited in this respect.

Figure 5D:
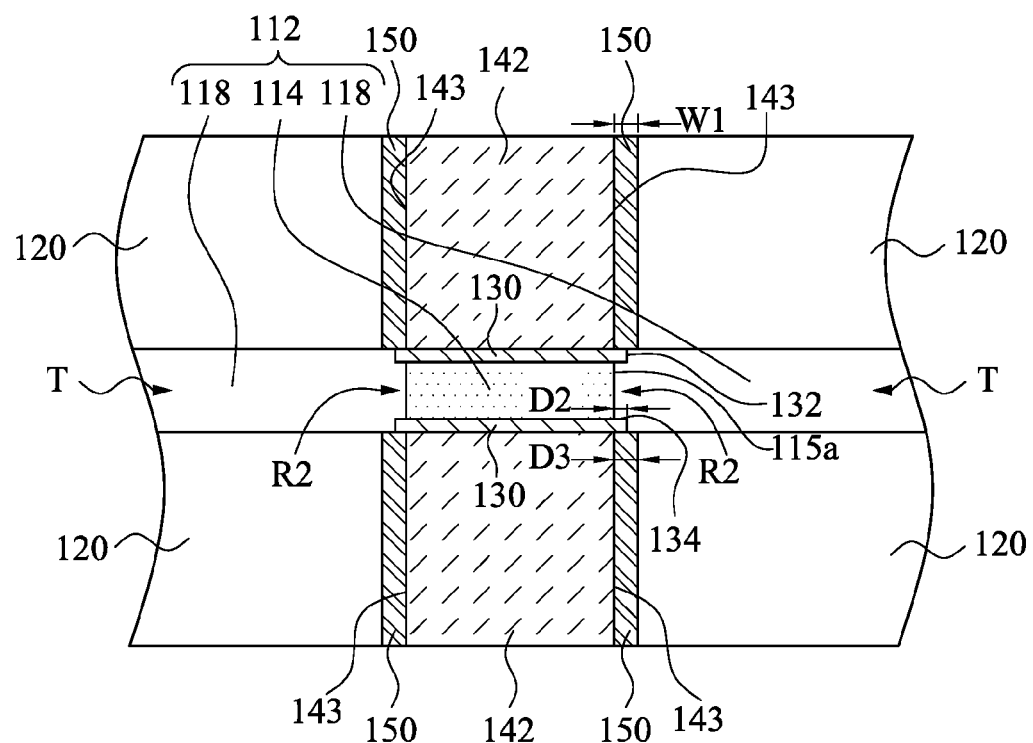
FIGS. 5D and 5E are cross-sectional views of the semiconductor device at stage of FIG. 5C in accordance with some other embodiments of the present disclosure.
Figure 5E:
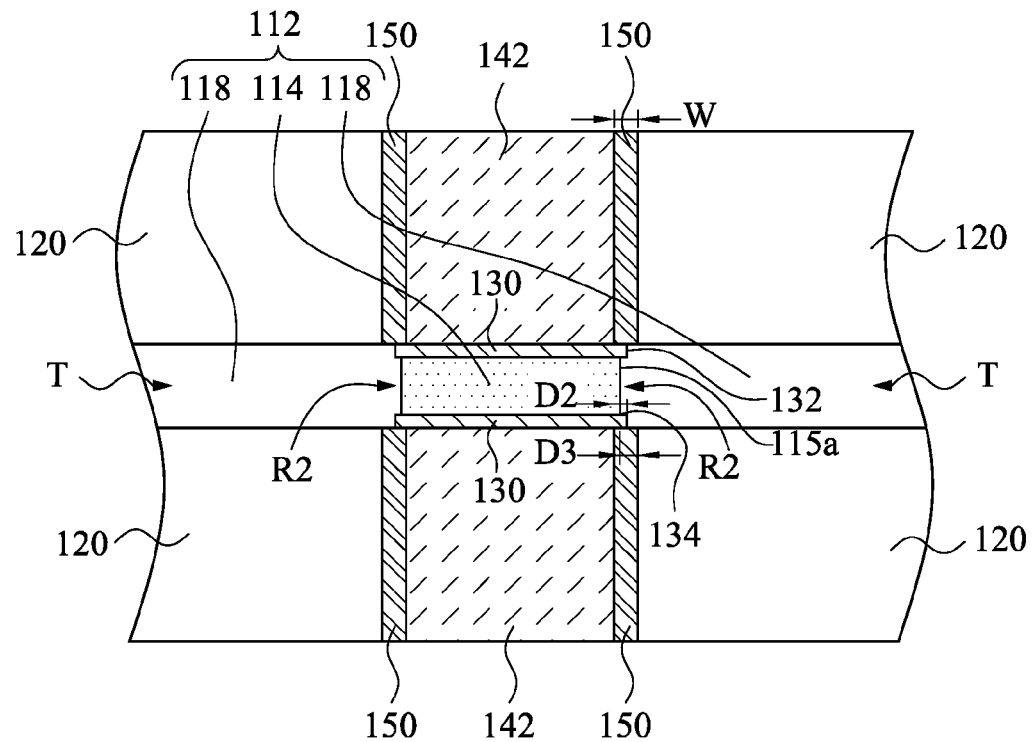

FIGS. 5D and 5E are cross-sectional views of the semiconductor device at stage of FIG. 5C in accordance with some other embodiments of the present disclosure. In FIG. 5D, the lateral distance D3 of the semiconductor fin 112 is substantially the same as the width W1 of the gate spacer 150. That is, the end surface 115a of the channel portion 114 is located substantially under the sidewall 143 of the dummy gate 142. In FIG. 5D, the lateral distance D3 of the semiconductor fin 112 is less than the width W1 of the gate spacer 150. That is, the surface 115a of the channel portion 114 is located under the gate spacer 150. Furthermore, the gate spacer 150 is present on at least a portion of the channel portion 114 of the semiconductor fin 112. The lateral distance D2 is about 0.5 angstrom to about 100 angstrom. Basically, embodiments fall within the claimed scope as long as the gate dielectric 130 extends farther than at least one end surface 115s of the channel portion 114 of the semiconductor fin 112.

Figure 6A:
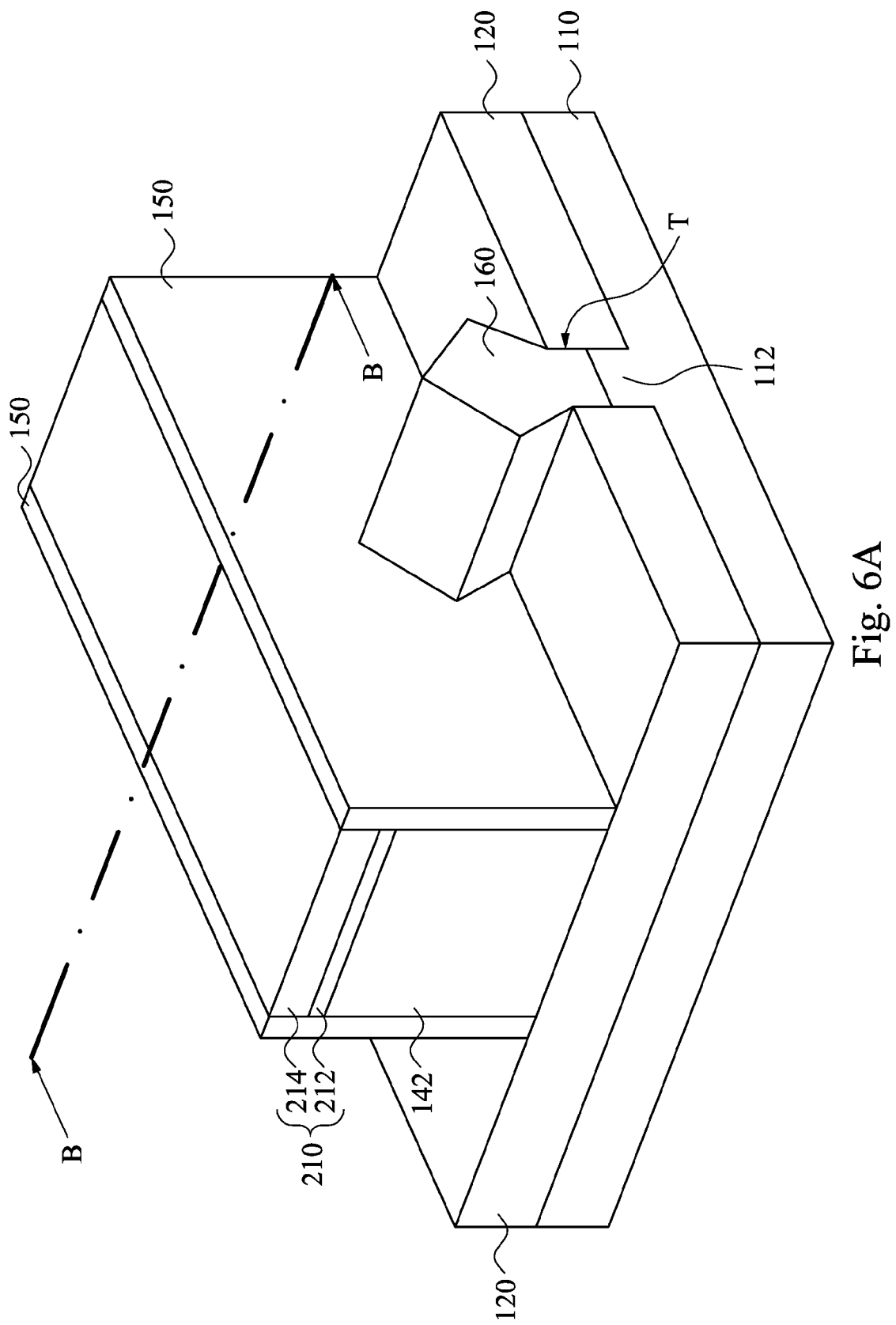
Figure 6B:
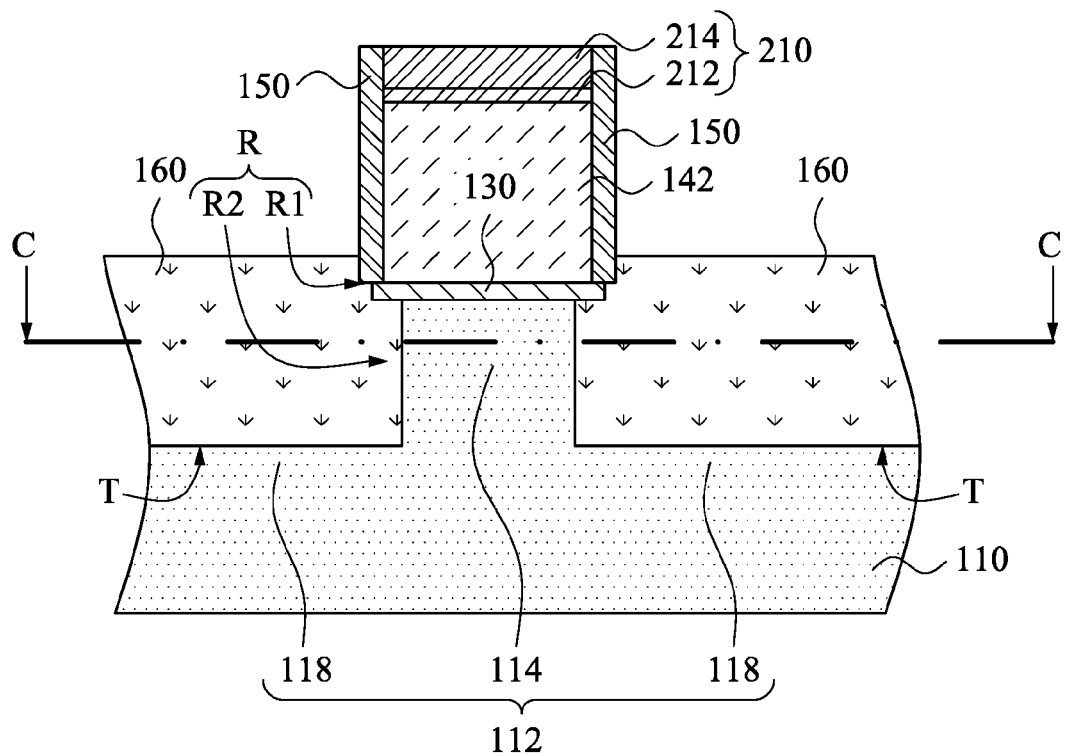
Figure 6C:
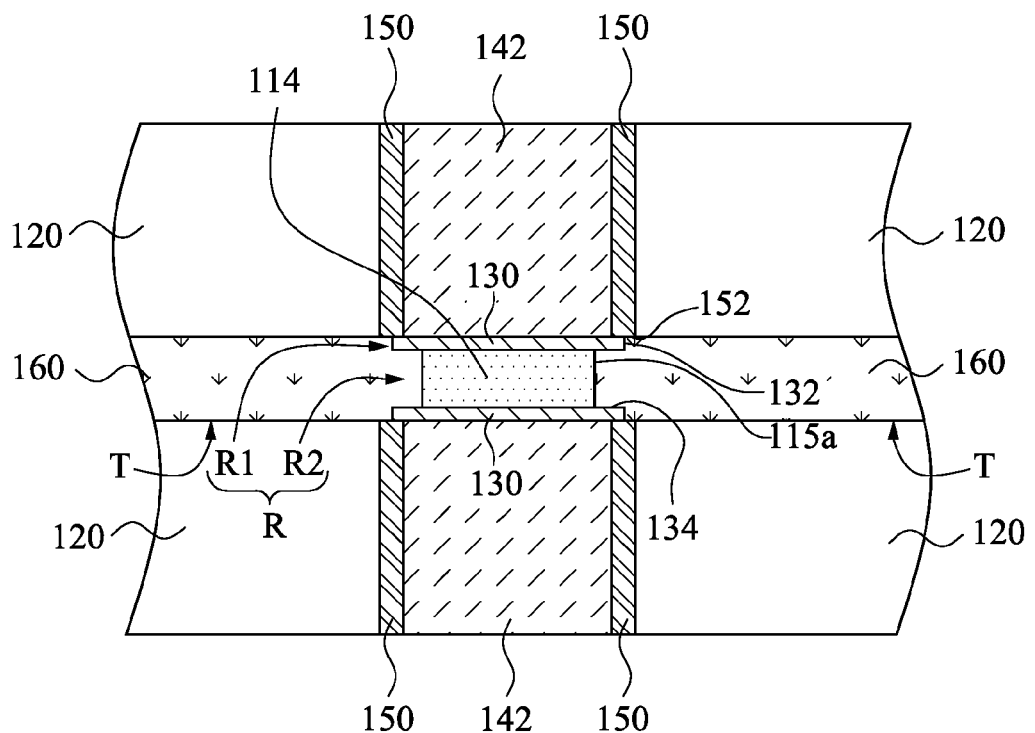

Reference is made to FIGS. 6A, 6B, and 6C. At least one epitaxy structure 160 is formed in the trench T of the semiconductor fins 112. The epitaxy structure 160 protrudes from the trench T and extends beneath the gate dielectric 130 to be in contact with the channel portion 114 of the semiconductor fin 112. In some embodiments, the epitaxy structure 160 is present on the inner wall 152 of the gate spacer 150. In some embodiments, the epitaxy structure 160 is present on the inner wall 134 of the gate dielectric 134. The epitaxy structure 160 can be an n-type epitaxy structure or a p-type epitaxy structure. The epitaxy structure 160 may be formed using one or more epitaxy or epitaxial (epi) processes, such that Si features, SiGe features, and/or other suitable features can be formed in a crystalline state on the semiconductor fin 112. In some embodiments, lattice constants of the epitaxy structure 160 is different from lattice constants of the semiconductor fin 112, and the epitaxy structure 160 is strained or stressed to enable carrier mobility of the semiconductor device and enhance the device performance. The epitaxy structure 160 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

In some embodiments, the epitaxy structure 160 may include SiP, SiC, SiPC, Si, III-V compound semiconductor materials, or combinations thereof for the n-type epitaxy structure, and the epitaxy structure 160 may include SiGe, SiGeC, Ge, Si, III-V compound semiconductor materials, or combinations thereof for the p-type epitaxy structure. The epitaxy structure 160 may have non-facet surfaces for the n-type epitaxy structure, and may have facet surfaces (see FIG. 6A) for the p-type epitaxy structure. During the formation of the n-type epitaxy structure, n-type impurities such as phosphorous or arsenic may be doped with the proceeding of the epitaxy. For example, when the epitaxy structure 160 includes SiC or Si, n-type impurities are doped. Moreover, during the formation of the p-type epitaxy structure, p-type impurities such as boron or $BF_2$ may be doped with the proceeding of the epitaxy. For example, when the epitaxy structure 160 includes SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 112 (e.g., silicon). Thus, a strained channel can be achieved to increase carrier mobility and enhance device performance. The epitaxy structure 160 may be in-situ doped. If the epitaxy structure 160 is not in-situ doped, a second implantation process (i.e., a junction implant process) is performed to dope the epitaxy structure 160. One or more annealing processes may be performed to activate the epitaxy structure 160. The annealing processes include rapid thermal annealing (RTA) and/or laser annealing processes.

Figure 7A:
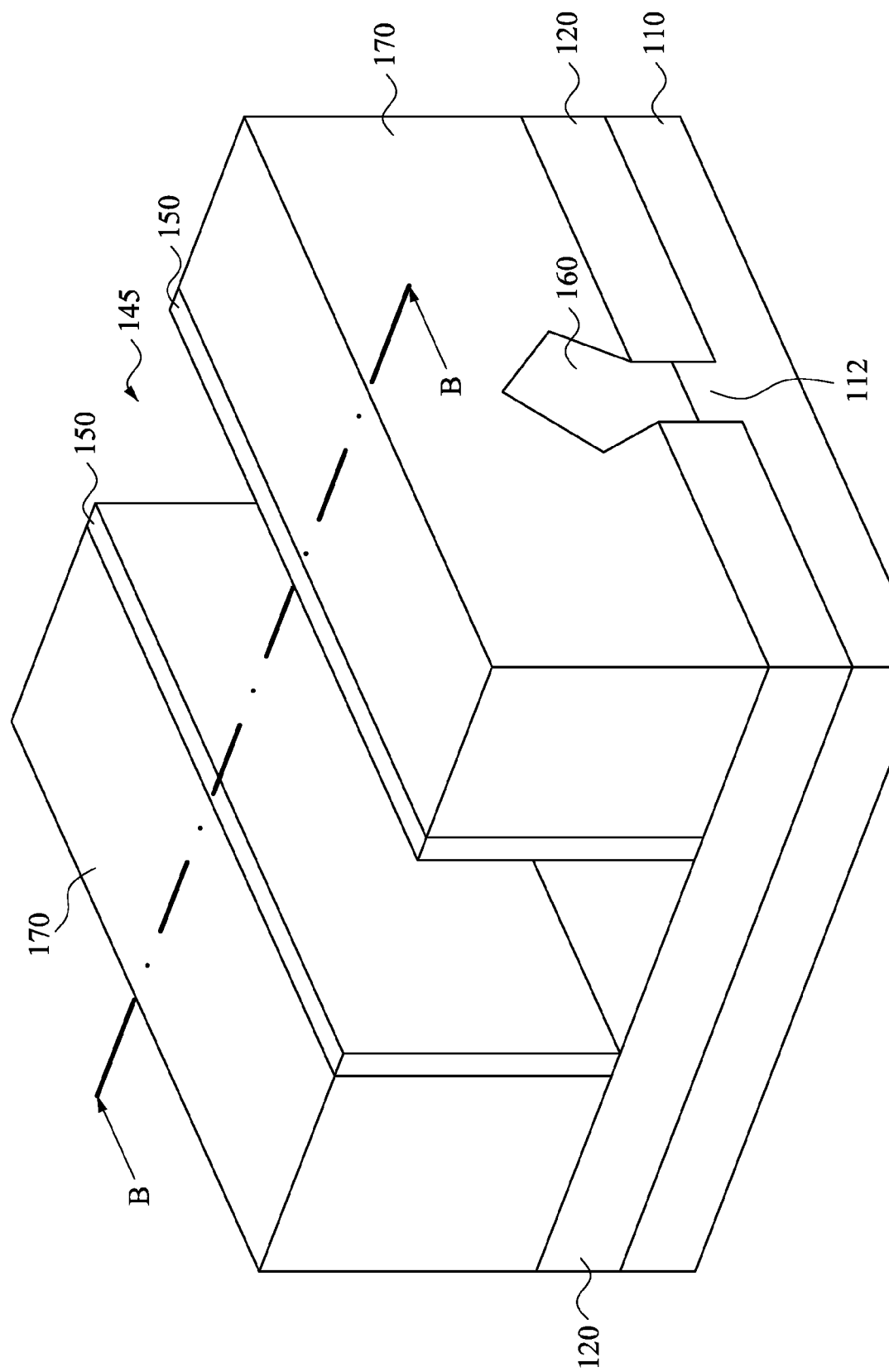
Figure 7B:
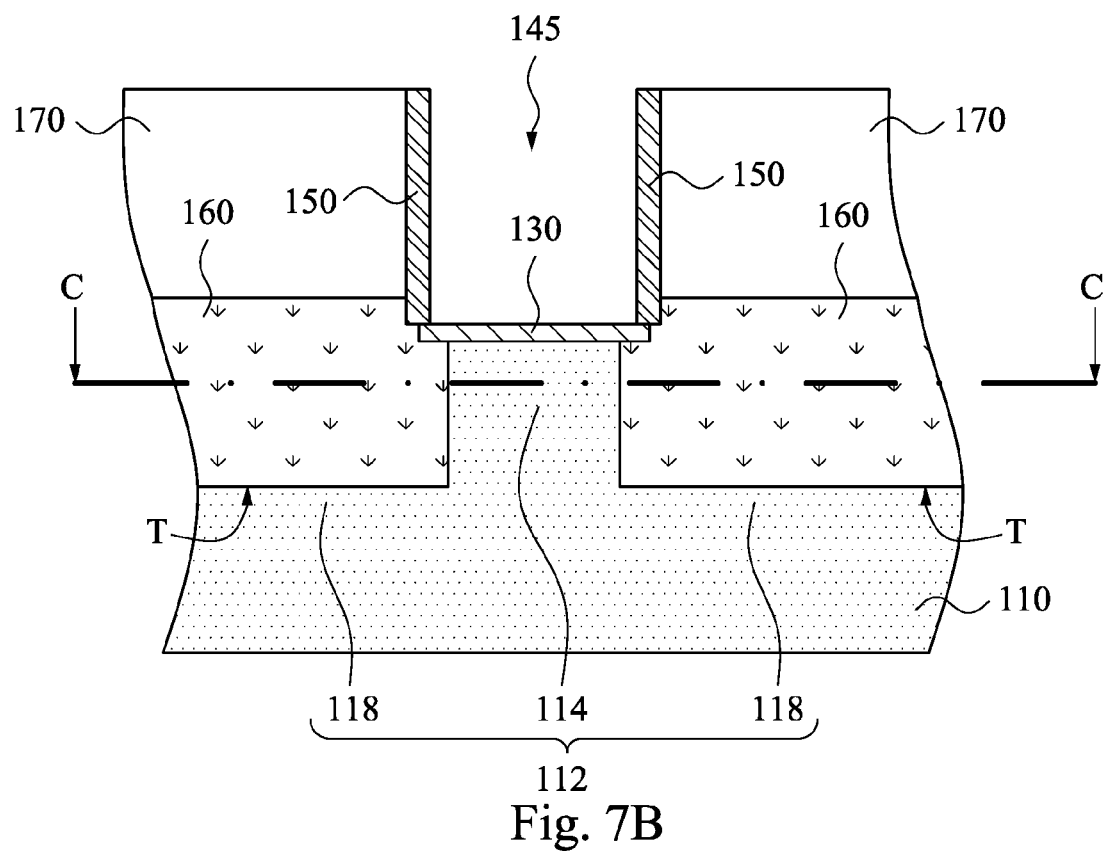
Figure 7C:
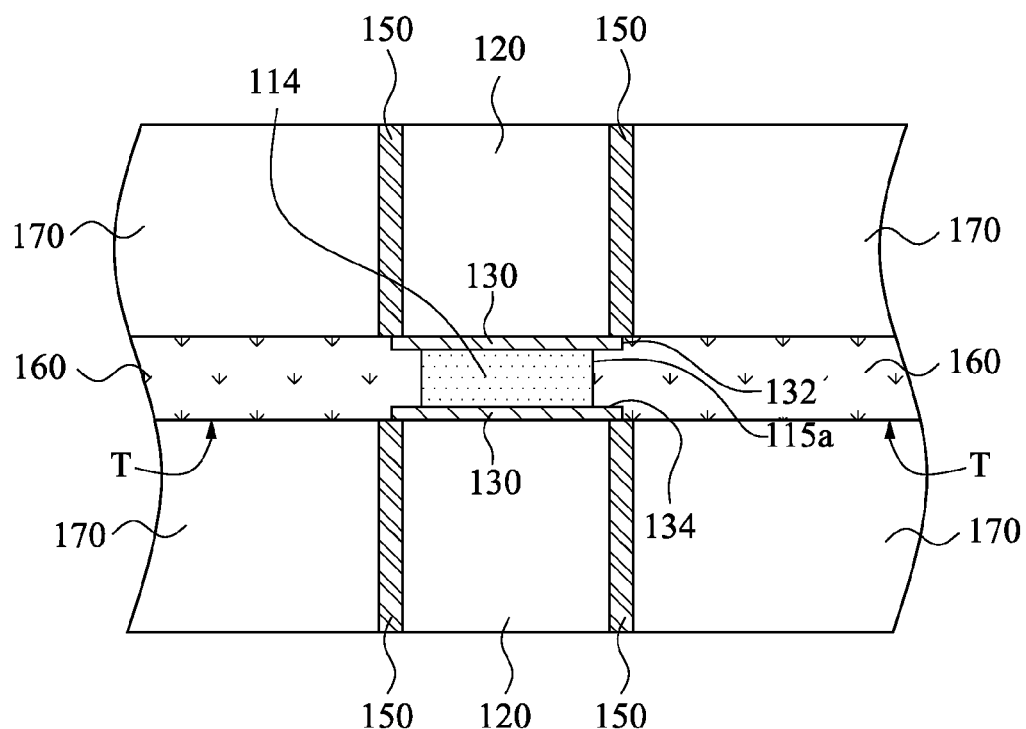

Reference is made to FIGS. 7A, 7B, and 7C. The dummy gate 142 and the mask layer 210 of FIG. 6A are removed to form an opening 145. Since the gate dielectric 130 contacts the gate spacers 150, and the channel portion 114 of the semiconductor fin 112 shrinks inward the gate dielectric 130, the opening 145 does not expose the semiconductor fin 112 even the gate dielectric 130 is partially removed during this process. As such, the gate dielectric 130 can isolate the gate electrode 180 (see FIG. 8A) formed in the opening 145 and the semiconductor fin 112. In some embodiments, before removing the dummy gate 140 and the mask layer 210, a dielectric layer 170 is formed at outer sides of the gate spacers 150 on the substrate 110. The dielectric layer 170 includes silicon oxide, oxynitride or other suitable materials. The dielectric layer 170 includes a single layer or multiple layers. The dielectric layer 170 is formed by a suitable technique, such as CVD or ALD. A chemical mechanical planarization (CMP) process may be applied to remove excessive dielectric layer 170 and expose the top surface of the dummy gate 140 to a subsequent dummy gate removing process.

In the present disclosure, a replacement gate (RPG) process scheme is employed. In some embodiments, in a RPG process scheme, a dummy polysilicon gate is formed first and is replaced later by a metal gate after high thermal budget processes are performed. In some embodiments, the dummy gate 140 (see FIG. 1B) is removed to form the opening 145 with the gate spacers 150 as its sidewalls. In some embodiments, the dummy gate 140 is removed while the gate dielectric 130 retains. The dummy gate 140 may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 8A:
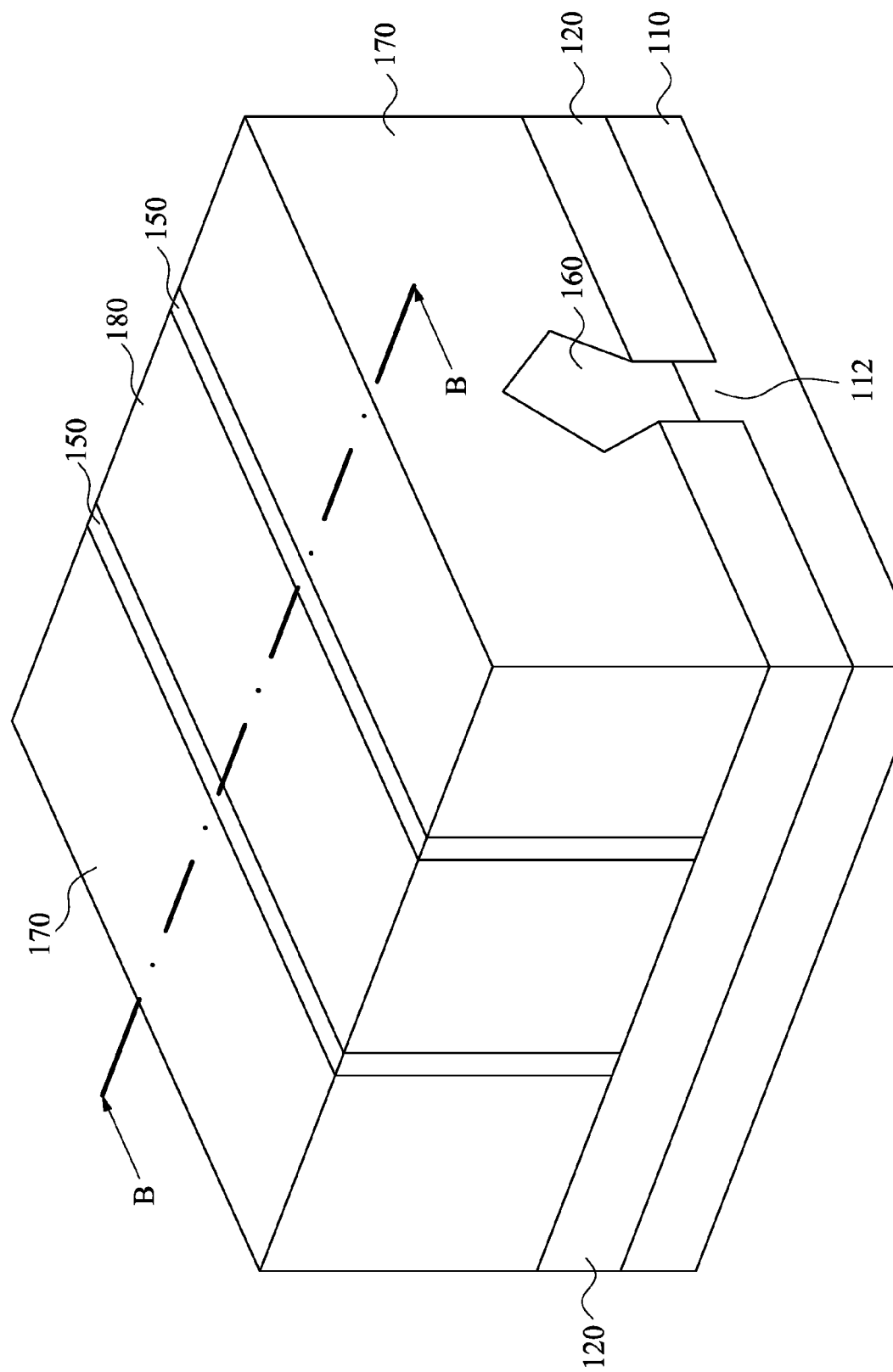
Figure 8B:
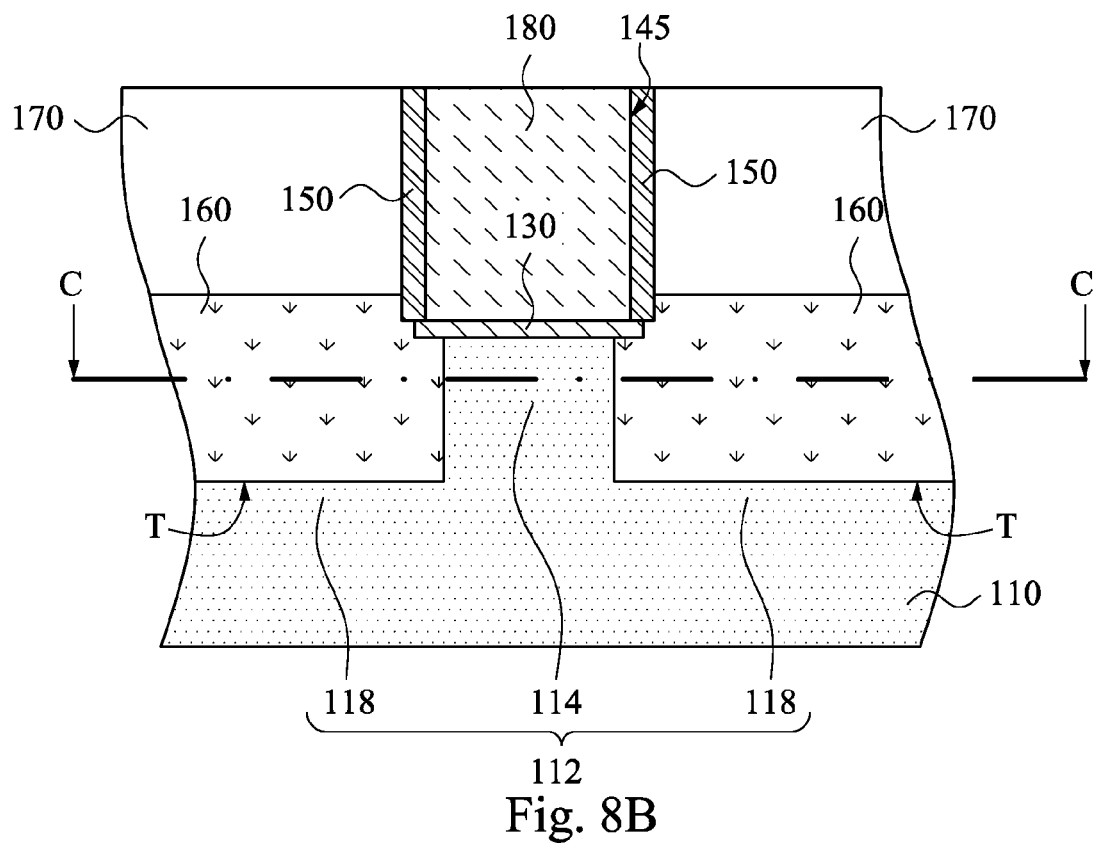
Figure 8C:
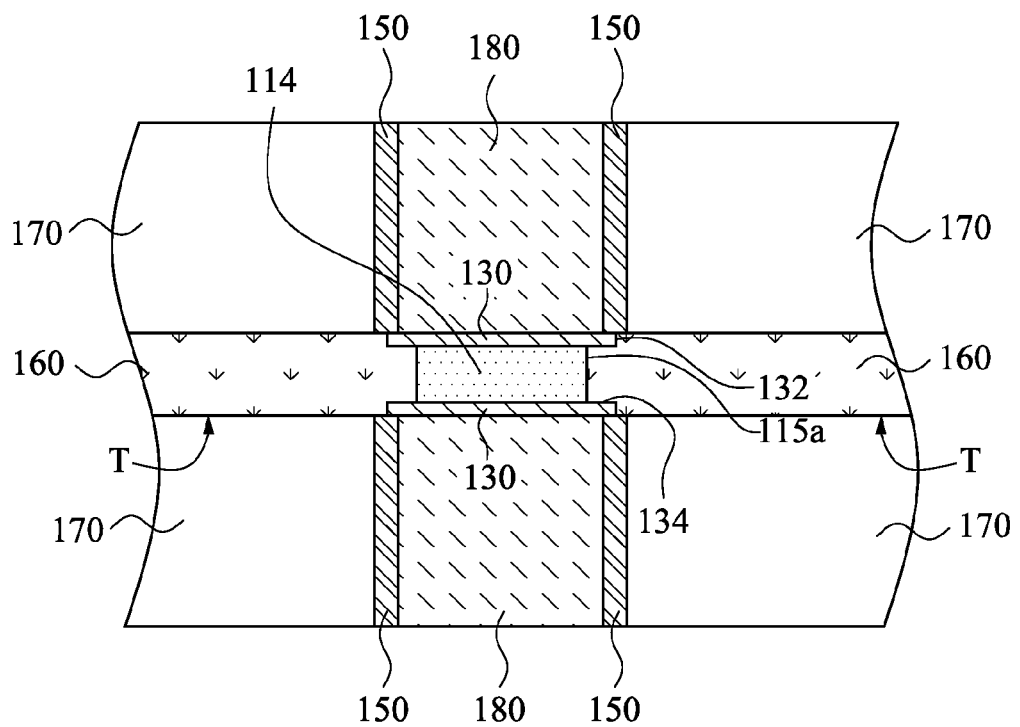

Reference is made to FIGS. 8A, 8B, and 8C. A gate electrode 180 is formed in the opening 145. In other words, the gate spacers 150 are disposed on opposite sides of the gate electrode 180. In FIG. 8C, the gate electrode 142 covers at least a portion of the epitaxy structure 160. The gate electrode 180 formed may also include gate dielectric layer(s), capping layer(s), fill layer(s), and/or other suitable layers that are desirable in a metal gate stack. A work function metal layer included in the gate electrode 180 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electroplating and/or other suitable process. In an embodiment, the gate electrode 180 formed is a p-type metal gate including a p-type work function layer. In some embodiments, the capping layer included in the gate electrode 180 may include refractory metals and their nitrides (e.g. TiN, TaN, $W_2N$, TiSiN, TaSiN). The cap layer may be deposited by PVD, CVD, Metal-organic chemical vapor deposition (MOCVD) and ALD. In some embodiments, the fill layer included in the gate electrode 180 may includes tungsten (W). The metal layer may be deposited by ALD, PVD, CVD, or other suitable process.

In the aforementioned embodiments, since the gate dielectric is in contact with the gate spacers, and the recessed portion of the semiconductor fin further extends beneath the gate dielectric (or, the channel portion of the semiconductor fin shrinks from the gate dielectric), the gate electrode does not expose the channel layer of the semiconductor fin when the dummy gate is removed. Accordingly, the (metal) gate electrode formed thereafter is not in contact with the channel portion of the semiconductor fin. As such, the gate dielectric can be a good isolation between the gate electrode and the semiconductor fin.

According to some embodiments, a semiconductor device includes at least one semiconductor fin, a gate electrode, at least one gate spacer, and a gate dielectric. The semiconductor fin includes at least one recessed portion and at least one channel portion. The gate electrode is present on at least the channel portion of the semiconductor fin. The gate spacer is present on at least one sidewall of the gate electrode. The gate dielectric is present at least between the channel portion of the semiconductor fin and the gate electrode. The gate dielectric extends farther than at least one end surface of the channel portion of the semiconductor fin.

According to some embodiments, a semiconductor device includes at least one semiconductor fin, a gate electrode, at least one gate spacer, a gate dielectric, and at least one epitaxy structure. The semiconductor fin includes at least one recessed portion and at least one channel portion. The gate electrode is present on at least the channel portion of the semiconductor fin. The gate spacer is present at least one sidewall of the gate electrode. The gate dielectric is present at least between the channel portion of the semiconductor fin and the gate electrode. A combination of the semiconductor fin, the gate dielectric, and the gate spacer define a recess therein. The recess has a first region and a second region. The first region has a width greater than that of the second region. The epitaxy structure is present on the recessed portion of the semiconductor fin and at least partially in the recess to be in contact with the channel portion of the semiconductor fin.

According to some embodiments, a method for manufacturing a semiconductor device includes forming a semiconductor fin on a substrate. A gate dielectric is formed to cover the semiconductor fin. A dummy gate is formed on the gate dielectric and the semiconductor fin. At least one gate spacer is formed on at least one sidewall of the dummy gate. At least a portion of the semiconductor fin and at least a portion of the gate dielectric uncovered by the dummy gate and the gate spacer are removed and a first recess is formed between the gate spacer and the semiconductor fin. At least another portion of the semiconductor fin covered by the gate dielectric are removed to form a second recess between the gate dielectric and the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   at least one semiconductor fin comprising at least one recessed portion and at least one channel portion;
   a gate electrode present on at least the channel portion of the semiconductor fin;
   at least one gate spacer present on at least one sidewall of the gate electrode;
   a gate dielectric present at least between the channel portion of the semiconductor fin and the gate electrode, wherein the gate dielectric extends farther than at least one end surface of the channel portion of the semiconductor fin; and
   at least one epitaxy structure present on the recessed portion of the semiconductor fin and in contact with the channel portion of the semiconductor fin, wherein the gate dielectric has opposite inner sidewalls, the inner sidewalls and the end surface of the channel portion of the semiconductor fin define a recess, and the epitaxy structure is at least partially present in the recess.

2. The semiconductor device of claim 1, wherein the gate dielectric extends farther than said at least one sidewall of the gate electrode.

3. The semiconductor device of claim 1, wherein the end surface of the channel portion of the semiconductor fin is separated from at least one sidewall of the gate spacer at a lateral distance, and the gate spacer has a width less than the lateral distance.

4. The semiconductor device of claim 1, wherein the end surface of the channel portion of the semiconductor fin is separated from at least one sidewall of the gate spacer at a lateral distance, and the gate spacer has a width greater than the lateral distance.

5. The semiconductor device of claim 1, wherein the end surface of the channel portion of the semiconductor fin is separated from at least one sidewall of the gate spacer at a lateral distance, and the gate spacer has a width substantially equal to the lateral distance.

6. The semiconductor device of claim 1, wherein the recess is further defined by the gate spacer.

7. The semiconductor device of claim 1, wherein the recess has a first region and a second region, the first region has a width greater than that of the second region.

8. A semiconductor device comprising:
   at least one semiconductor fin comprising at least one recessed portion and at least one channel portion;
   a gate electrode present on at least the channel portion of the semiconductor fin;
   at least one gate spacer present on at least one sidewall of the gate electrode;
   a gate dielectric present at least between the channel portion of the semiconductor fin and the gate electrode, wherein a combination of the semiconductor fin, the gate dielectric, and the gate spacer define a recess therein, the recess has a first region and a second region, the first region has a width greater than that of the second region; and
   at least one epitaxy structure present on the recessed portion of the semiconductor fin and at least partially in the recess to be in contact with the channel portion of the semiconductor fin.

9. The semiconductor device of claim 8, wherein the gate spacer is in contact with the gate dielectric.

10. The semiconductor device of claim 8, wherein an end surface of the gate dielectric is separated from at least one sidewall of the gate spacer at a lateral distance, and the gate spacer has a width greater than the lateral distance.

11. The semiconductor device of claim 8, wherein the epitaxy structure is present on at least one inner wall of the gate spacer.

12. The semiconductor device of claim 8, wherein the epitaxy structure is present on at least one inner wall of the gate dielectric.

13. The semiconductor device of claim 8, wherein the gate electrode is further present on a part of the recessed portion of the semiconductor fin.

14. The semiconductor device of claim 8, wherein the gate spacer is present on a part of the channel portion of the semiconductor fin.

15. A semiconductor device comprising:
   at least one semiconductor fin comprising at least one recessed portion and at least one channel portion;
   a gate electrode present on at least the channel portion of the semiconductor fin;
   at least one gate spacer present on at least one sidewall of the gate electrode;
   a gate dielectric present at least between the channel portion of the semiconductor fin and the gate electrode, wherein the gate dielectric extends farther than at least one end surface of the channel portion of the semiconductor fin; and
   at least one epitaxy structure present on the recessed portion of the semiconductor fin and in contact with the channel portion of the semiconductor fin, wherein the recessed portion of the semiconductor fin, the channel portion of the semiconductor fin, and the gate dielectric define a recess, and the epitaxy structure is at least partially present in the recess.

16. The semiconductor device of claim 15, wherein the gate electrode overlies the epitaxy structure.

17. The semiconductor device of claim 15, wherein the recess is further defined by the gate spacer.

18. The semiconductor device of claim 15, wherein the gate dielectric has a sidewall in contact with the epitaxy structure and the channel portion of the semiconductor fin.

19. The semiconductor device of claim 15, wherein the recess has a first region and a second region, the first region has a width greater than that of the second region.

20. The semiconductor device of claim 15, wherein the epitaxy structure is in contact with the gate spacer.

* * * * *